(12) United States Patent
Tahara

(10) Patent No.: US 9,786,473 B2
(45) Date of Patent: Oct. 10, 2017

(54) METHOD OF PROCESSING WORKPIECE

(71) Applicant: TOKYO ELECTRON LIMITED, Tokyo (JP)

(72) Inventor: Shigeru Tahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/338,626

(22) Filed: Oct. 31, 2016

(65) Prior Publication Data

US 2017/0133206 A1    May 11, 2017

(30) Foreign Application Priority Data

Nov. 5, 2015 (JP) ................. 2015-217630

(51) Int. Cl.
*H01L 21/312* (2006.01)
*B44C 1/22* (2006.01)
*H01J 37/32* (2006.01)

(52) U.S. Cl.
CPC ...... *H01J 37/32449* (2013.01); *H01J 37/321* (2013.01); *H01J 37/32183* (2013.01); *H01J 37/32697* (2013.01); *H01J 37/32715* (2013.01); *H01J 2237/334* (2013.01)

(58) Field of Classification Search
None
See application file for complete search history.

(56) References Cited

U.S. PATENT DOCUMENTS

| 4,855,015 A * | 8/1989 | Douglas ............ H01L 21/3065 204/192.33 |
| 2005/0186801 A1* | 8/2005 | Uno .................... H01L 21/3065 438/706 |
| 2007/0111529 A1* | 5/2007 | Nishino ............ H01L 21/31116 438/710 |
| 2008/0067145 A1* | 3/2008 | Wang ................ H01L 21/02079 216/57 |

FOREIGN PATENT DOCUMENTS

| JP | H08-203847 A | 8/1996 |
| JP | 2013-225604 A | 10/2013 |

OTHER PUBLICATIONS

Okada et al (etching of crystalline silicon using germanium tetrafluoride; J. Elecrochem. Soc., vol. 137, No. 6,pp. 1957-1959; Jun. 1990).*

(Continued)

*Primary Examiner* — Shamim Ahmed
(74) *Attorney, Agent, or Firm* — Studebaker & Brackett PC

(57) ABSTRACT

Provided is a method of processing a wafer, which is performed in a processing container of a plasma processing apparatus. This method is a plasma etching method performed on a porous film formed of SiOCH, and is a method of enabling the suppression of various types of deterioration such as an increase in the dielectric constant of the porous film. The wafer includes the porous film and a mask provided on the porous film. The method includes a process of generating a plasma of a first gas and a plasma of a second gas in the processing container and etching the porous film using the mask. The porous film contains SiOCH, and the first gas contains a fluorocarbon-based gas. The second gas contains $GeF_4$ gas.

7 Claims, 6 Drawing Sheets

(56) References Cited

OTHER PUBLICATIONS

John G Shaw et al.; "Monte Carlo simulations of plasma-deposited amorphous silicon"; Journal of Applied Physics; Jul. 15, 1988; pp. 699-701; vol. 64; No. 2; USA.
Akimasa Yuuki et al.; "A Study on Radical Fluxes in Silane Plasma CVD from Trench Coverage Analysis"; Japanese Journal of Applied Physics <Part 1 Regular Papers & Short Notes>; Feb. 1989; pp. 212-218; vol. 28; No. 2; Japan.
N. Posseme et al.; "New fluorocarbon free chemistry proposed as solution to limit porous SiOCH film modification during etching"; IEEE; IITC 2013; LET/AMAT; 2013.
Ph. Brun et al.; "Plasma Etch Challenges at 14nm and Beyond Technology Nodes in the BEOL"; IEEE; IITC 2015; 3-1 ST Mircoelectronics; 2015; pp. 21-23.

* cited by examiner

METHOD OF PROCESSING WORKPIECE

CROSS-REFERENCE TO RELATED APPLICATION

This application is based on and claims priority from Japanese Patent Application No. 2015-217630 filed on Nov. 5, 2015, with the Japan Patent Office, the disclosures of which are incorporated herein in their entireties by reference.

TECHNICAL FIELD

Exemplary embodiments of the present disclosure relates to a method of processing a workpiece through plasma etching.

BACKGROUND

Hitherto, studies of various Si-based elements using a porous film have been made. A plurality of holes are formed inside the porous film, and the porous film may function as a low dielectric constant film (sometimes referred to as a low-k film) due to the plurality of holes. In a case where the porous film is processed through etching, a fluorocarbon-based gas is generally used. However, a technique using $SiF_4$ gas has also been studied (Non Patent Literature 1: "New fluorocarbon free chemistry proposed as solution to limit porous SiOCH film modification during etching", N. Posseme, et al., IITC 2013, LET/AMAT, and Non Patent Literature 2: "Plasma Etch Challenges at 14 nm and Beyond Technology Nodes in the BEOL", Ph. Brun, et al., IITC 2015 3-1 ST Micro/Leti). In a case of etching using $SiF_4$ gas, a Si (silicon)-based film is formed on the surface of the porous film as a protective film. In addition, for the protective film, a technique regarding a film containing Ge (germanium) as well as the Si-based film described above has been developed (Patent Literature 1: Japanese Patent Application Laid-Open Publication No. H8-203847, and Patent Literature 2: Japanese Patent Application Laid-Open Publication No. 2013-225604).

SUMMARY

In a first aspect, there is provided a method of processing a workpiece, performed in a processing container of a plasma processing apparatus. The workpiece includes a porous film and a mask provided on the porous film. The method includes a process (referred to as "process a") of generating a plasma in the processing container using a first gas and a second gas and etching the porous film using the mask. The porous film contains SiOCH. The first gas contains a fluorocarbon-based gas. The second gas contains $GeF_4$ gas.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
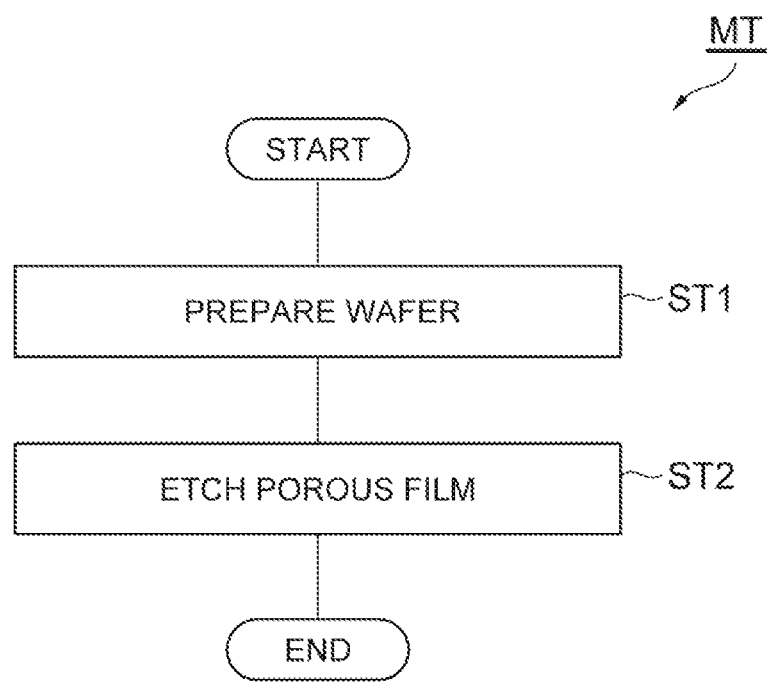
FIG. 1 is a flowchart showing a method of an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

There may be cases where the porous film described above is formed of a SiOCH material. When the porous film is subjected to anisotropic processing through dry etching using a fluorocarbon-based gas, various types of active species such as active species of fluorine or active species of oxygen reach the inner surfaces of the plurality of holes from the surface of the porous film, and carbon components are separated from the surface and the inner surfaces due to the various types of active species such that an altered layer containing $SiO_2$ components is formed on the surface and the inner surfaces. Therefore, there may be cases where various types of deterioration regarding the dielectric constant, dielectric strength, the reliability of the film, and the like occur in the porous film.

In a case of etching using the $SiF_4$ gas described above, since the Si-based film is formed on the surface of the porous film as the protective film, the suppression of various types of deterioration in the porous film can be expected to some extent. However, since the surface of the porous film formed of SiOCH described above contains Si and the film provided by the $SiF_4$ gas as the protective film on the surface also becomes a Si-based film containing Si like the surface, an effect of protection of the surface is insufficient in the case where the $SiF_4$ gas is used during the etching. In addition, a case of using a film containing Ge as the protective film may be considered. However, in this case, details and the relation between the embodiment of the formation of the protective film and the embodiment of the etching are not obvious. As described above, for a plasma etching method performed on a porous film formed of SiOCH, a method of enabling the suppression of various types of deterioration such as an increase in the dielectric constant of the porous film needs to be provided.

In a first aspect, there is provided a method of processing a workpiece, performed in a processing container of a plasma processing apparatus. The workpiece includes a porous film and a mask provided on the porous film. The method includes a process (referred to as "process a") of generating a plasma in the processing container using a first gas and a second gas and etching the porous film using the mask. The porous film contains SiOCH. The first gas contains a fluorocarbon-based gas. The second gas contains $GeF_4$ gas. In a case where the porous film formed of SiOCH is etched by the plasma of the fluorocarbon-based gas containing F (fluorine), C (carbon) becomes separated from the side surfaces of the porous film (surfaces formed during the etching) and the inner surfaces of a plurality of holes of the porous film on the side surface due to the active species of F (fluorine) and the like generated by the plasma such that the porous film exhibits hydrophilicity. Therefore, there may be cases where the dielectric constant, dielectric strength, reliability, and the like are deteriorated. However, in a case where the porous film is etched by the plasma in the process a, a film of Ge (germanium) having relatively high resistance to erosion due to the active species of F (fluorine) and the like is formed by active species of Ge (germanium) generated by the plasma, on the side surfaces of the porous film (surfaces formed during the etching) and the inner surfaces of the plurality of holes of the porous film such that the separation of C (carbon) from the side surfaces and the inner surfaces due to the active species of F (fluorine) and the like is suppressed. Therefore, the deterioration in the dielectric constant, dielectric strength, reliability, and the like of the porous film is suppressed.

In the process a of the first aspect, a gas mixture of the first gas and the second gas may be supplied into the processing container, and a plasma of the gas mixture may be generated in the processing container. As described above, when the plasma of the gas mixture containing the fluorocarbon-based gas and the $GeF_4$ gas is used, the effect of protection by the film of Ge (germanium) can be obtained while the etching performed by the active species of F (fluorine) and the like can be achieved in only a single etching process using the gas mixture. Therefore, while sufficiently preventing a situation in which the characteristics of the porous film are deteriorated due to the separation of C (carbon) due to the active species of F (fluorine) and the like, the etching of the porous film can be suitably and easily performed.

The process a of the first aspect may include a first process of generating a plasma of the first gas, a second process of purging a space in the processing container after execution of the first process, a third process of generating a plasma of the second gas after execution of the second process, and a fourth process of purging the space in the processing container after execution of the third process. As described above, by separating the first process of performing etching using the plasma of the fluorocarbon-based gas and the third process of forming the protective film of Ge (germanium) using the plasma of the $GeF_4$ gas from each other, the etching process performed on the porous film can be precisely and flexibly performed so as to suppress the separation of C (carbon) and the like and maintain the characteristics of the porous film. In addition, by omitting the purging processes of the second process and the fourth process, the plasma may be continuously discharged.

In the process a of the first aspect, the first process and the second process may be executed once or several times, and the third process and the fourth process may be executed once or several times. As described above, by appropriately adjusting the number of times of execution of the first process of performing the etching using the plasma of the fluorocarbon-based gas and the number of times of execution of the third process of forming the protective film of Ge (germanium) using the plasma of the $GeF_4$ gas, a balance between the etching performed due to the active species of F (fluorine) and the like and the effect of protection by the film of Ge (germanium) can be sufficiently and suitably obtained. Therefore, the etching of the porous film can be more precisely and flexibly performed while maintaining the characteristics of the porous film.

In a second aspect, the fluorocarbon-based gas of the first gas of the gas mixture described above may contain $CF_4$ gas, and a flow rate of the $GeF_4$ gas contained in the second gas of the gas mixture may be 10 percent or more of a flow rate of the $CF_4$ gas contained in the first gas. As described above, in a case where the $CF_4$ gas and the $GeF_4$ gas are contained in the gas mixture, it became apparent that by causing the flow rate of the $GeF_4$ gas to be 10 percent or more of the flow rate of the $CF_4$ gas, the etching of the porous film can be suitably performed while maintaining the characteristics of the porous film.

In a third aspect, the fluorocarbon-based gas of the first gas of the gas mixture described above may contain $C_4F_8$ gas, and a flow rate of the $GeF_4$ gas contained in the second gas of the gas mixture may be ½ or more of a flow rate of the $C_4F_8$ gas contained in the first gas. In addition, the fluorocarbon-based gas of the first gas of the gas mixture described above may contain $U_8$ gas, and a flow rate of the $GeF_4$ gas contained in the second gas of the gas mixture may be equal to or more than a flow rate of the $C_4F_8$ gas contained in the first gas. As described above, in the case where the $C_4F_8$ gas and the $GeF_4$ gas are contained in the gas mixture, it became apparent that by causing the flow rate of the $GeF_4$ gas to be ½ or more of the flow rate of the $C_4F_8$ gas or equal to or more than the flow rate of the $C_4F_8$ gas, the etching of the porous film can be suitably performed while maintaining the characteristics of the porous film.

As described above, in a plasma etching method performed on a porous film formed of SiOCH, various types of deterioration such as an increase in the dielectric constant of the porous film can be suppressed.

Hereinafter, various exemplary embodiments will be described in detail with reference to the drawings. In addition, in each of the drawings, the same or equivalent elements are denoted by the same reference signs.

FIG. 1 is a flowchart showing a method of an exemplary embodiment. A method MT of the exemplary embodiment shown in FIG. 1 is a method of processing a workpiece (hereinafter, sometimes referred to as "wafer"). In addition, in the method MT of the exemplary embodiment, a series of processes can be executed using a single plasma processing apparatus.

Figure 2:
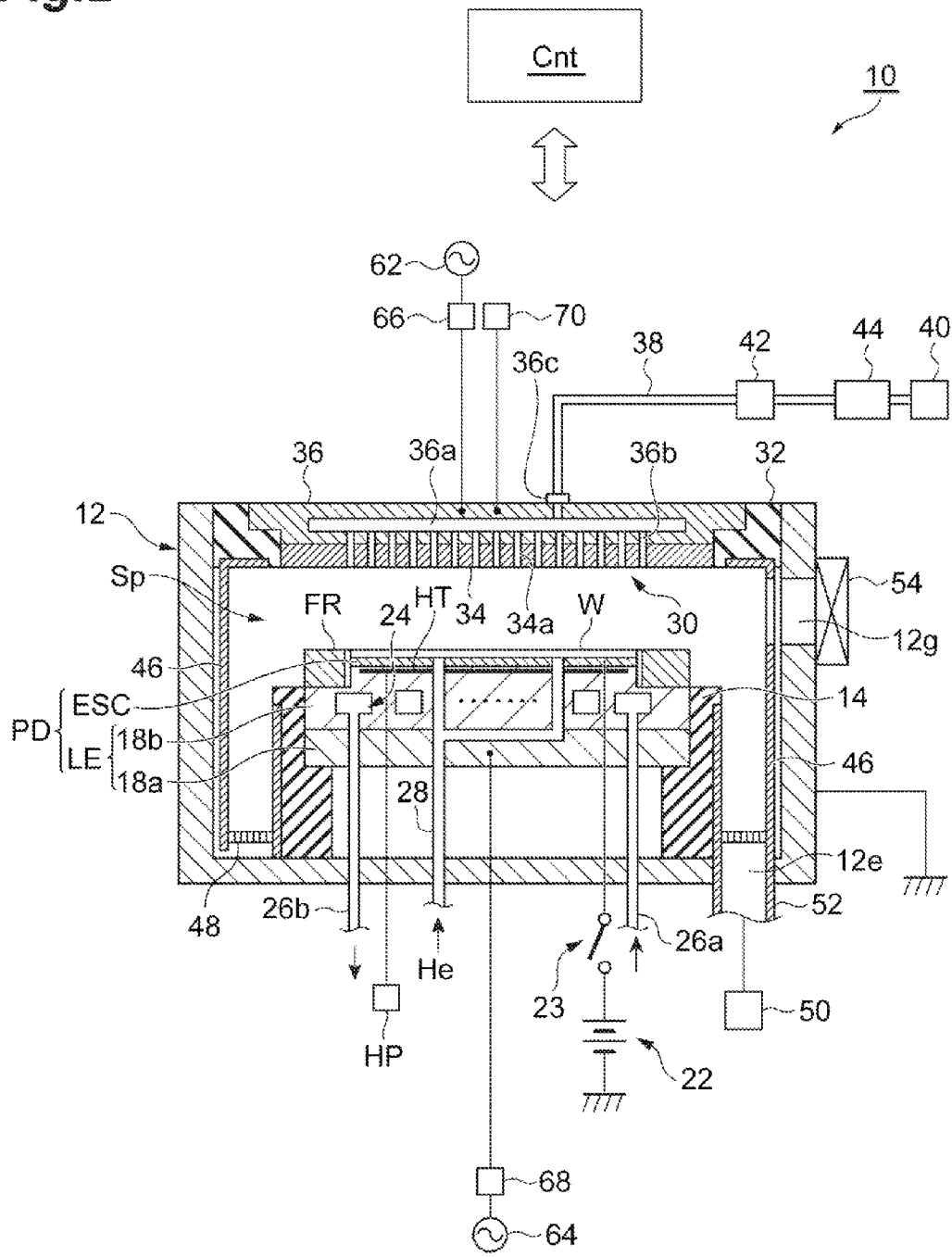
FIG. 2 is a view illustrating an example of an exemplary plasma processing apparatus.

FIG. 2 is a view illustrating an example of the plasma processing apparatus. FIG. 2 schematically illustrates the sectional structure of a plasma processing apparatus 10 which can be used in various exemplary embodiments of the method of processing a exemplary workpiece. As illustrated in FIG. 2, the plasma processing apparatus 10 is a capacitively coupling type plasma etching apparatus.

The plasma processing apparatus 10 includes a processing container 12, an exhaust port 12e, an import and export port 12g, a support portion 14, a placing table PD, a DC power source 22, a switch 23, a refrigerant flow passage 24, a pipe 26a, a pipe 26b, an upper electrode 30, an insulating shield member 32, an electrode plate 34, gas discharge holes 34a, an electrode support body 36, a gas diffusion chamber 36a, gas flow holes 36b, a gas introduction port 36c, a gas supply pipe 38, a gas source group 40, a valve group 42, a flow rate controller group 44, a deposit shield 46, an exhaust plate 48, an exhaust device 50, an exhaust pipe 52, a gate valve 54, a first high-frequency power source 62, a second high-frequency power source 64, a matching device 66, a matching device 68, a power source 70, a controller Cnt, a focus ring FR, a heater power source HP, and a heater 1-1T. The placing table PD includes an electrostatic chuck ESC, and a lower electrode LE. The lower electrode LE includes a first plate 18a and a second plate 18b. The processing container 12 defines a processing space Sp.

The processing container 12 has a substantially cylindrical shape. For example, the processing container 12 is formed of aluminum. The inner wall surface of the processing container 12 is subjected to an anodic oxidation treatment. The processing container 12 is grounded for safety.

The support portion 14 is provided on the bottom portion of the processing container 12, on the inside of the processing container 12. The support portion 14 has a substantially cylindrical shape. For example, the support portion 14 is formed of an insulating material. The insulating material forming the support portion 14 may contain oxygen like quartz. The support portion 14 extends in the vertical direction from the bottom portion of the processing container 12 in the processing container 12.

The placing table PD is provided in the processing container 12. The placing table PD is supported by the support portion 14. The placing table PD holds a wafer W on the upper surface of the placing table PD. The wafer W is a workpiece. The placing table PD includes the lower electrode LE and the electrostatic chuck ESC.

The lower electrode LE includes the first plate 18a and the second plate 18b. The first plate 18a and the second plate 18b are formed of metal such as aluminum, for example. The first plate 18a and the second plate 18b have substantially disk shapes. The second plate 18b is provided on the first plate 18a. The second plate 18b is electrically connected to the first plate 18a.

The electrostatic chuck ESC is provided on the second plate 18b. The electrostatic chuck ESC has a structure in which an electrode of a conductive film is disposed between a pair of insulating layers or between a pair of insulating sheets.

The DC power source 22 is electrically connected to an electrode of the electrostatic chuck ESC via a switch 23. The electrostatic chuck ESC causes the wafer W to be adsorbed thereon by an electrostatic force such as the Coulomb force generated by a DC voltage applied from the DC power source 22. Accordingly, the electrostatic chuck ESC can hold the wafer W.

The focus ring FR is disposed on the circumferential edge portion of the second plate 18b so as to surround the edge of the wafer W and the electrostatic chuck ESC. The focus ring FR is provided to improve the uniformity of etching. The focus ring FR is formed of a material which is appropriately selected depending on the material of a film as an etching object, and for example, may be formed of quartz.

The refrigerant flow passage 24 is provided in the inner portion of the second plate 18b. The refrigerant flow passage 24 forms a temperature adjusting mechanism. A refrigerant is supplied to the refrigerant flow passage 24 via the pipe 26a from a chiller unit provided on the outside of the processing container 12. The refrigerant supplied to the refrigerant flow passage 24 is returned to the chiller unit via the pipe 26b. As described above, the refrigerant is supplied to the refrigerant flow passage 24 so as to be circulated. By controlling the temperature of the refrigerant, the temperature of the wafer W supported by the electrostatic chuck ESC is controlled. A gas supply line 28 supplies a heat transfer gas, for example, He gas from a heat transfer gas supply mechanism between the upper surface of the electrostatic chuck ESC and the rear surface of the wafer W.

The heater HT is a heating element. For example, the heater HT is buried in the second plate 18b. The heater power source HP is connected to the heater HT. As power is supplied from the heater power source HP to the heater HT, the temperature of the placing table PD is adjusted, and the temperature of the wafer W placed on the placing table PD is adjusted. In addition, the heater HT may be embedded in the electrostatic chuck ESC.

The upper electrode 30 is disposed above the placing table PD to oppose the placing table PD. The lower electrode LE and the upper electrode 30 are provided substantially in parallel to each other. The processing space Sp is provided between the upper electrode 30 and the lower electrode LE. The processing space Sp is a spatial region for performing plasma processing on the wafer W.

The upper electrode 30 is supported at the upper portion of the processing container 12 via the insulating shield member 32. The insulating shield member 32 is formed of an insulating material, and for example, may contain oxygen like quartz. The upper electrode 30 may include the electrode plate 34 and the electrode support body 36. The electrode plate 34 faces the processing space Sp. The electrode plate 34 includes a plurality of the gas discharge holes 34a. In the exemplary embodiment, the electrode plate 34 may be formed of silicon. In another exemplary embodiment, the electrode plate 34 may be formed of silicon oxide.

The electrode support body 36 detachably supports the electrode plate 34 and for example, may be formed of a conductive material such as aluminum. The electrode support body 36 may have a water-cooled structure. The gas diffusion chamber 36a is provided in the electrode support body 36. A plurality of the gas flow holes 36b respectively communicate with the gas discharge holes 34a. Each of the plurality of gas flow holes 36b extends downward (toward the placing table PD side) from the gas diffusion chamber 36a.

The gas introduction port 36c introduces a processing gas to the gas diffusion chamber 36a. The gas introduction port 36c is provided in the electrode support body 36. The gas supply pipe 38 is connected to the gas introduction port 36c.

The gas source group 40 is connected to the gas supply pipe 38 via the valve group 42 and the flow rate controller group 44. The gas source group 40 includes a plurality of gas sources. The plurality of gas sources may include a source of oxygen gas, a source of nitrogen gas, a source of a fluorocarbon-based gas, a source of $GeF_4$ gas, and a source of a noble gas. In addition, the plurality of gas sources may also include a source of $SiF_4$ gas. As the fluorocarbon-based gas, for example, $C_4F_8$ gas, $CF_4$ gas, or the like may be used. As the noble gas, for example, Ar gas, He gas, or the like may be used.

The valve group 42 includes a plurality of valves. The flow rate controller group 44 includes a plurality of flow rate controllers such as mass flow controllers. Each of the plurality of gas sources of the gas source group 40 is connected to the gas supply pipe 38 via a corresponding valve of the valve group 42 and a corresponding flow rate controller of the flow rate controller group 44. Therefore, the plasma processing apparatus 10 can supply gases from one or more gas sources selected from among the plurality of gas sources of the gas source group 40 into the processing container 12 at individually adjusted flow rates.

In addition, in the plasma processing apparatus 10, the deposit shield 46 is detachably provided along the inner wall of the processing container 12. The deposit shield 46 is also provided on the outer circumference of the support portion 14. The deposit shield 46 is for preventing the adhesion of etching by-products (deposits) to the processing container 12 and may be formed by coating an aluminum material with ceramic such as $Y_2O_3$. For example, the deposit shield 46 may be formed of a material containing oxygen like quartz other than $Y_2O_3$.

The exhaust plate 48 is provided on the bottom portion side of the processing container 12 between the support portion 14 and the side wall of the processing container 12.

For example, the exhaust plate 48 may be formed by coating an aluminum material with ceramic such as $Y_2O_3$. The exhaust port 12e is provided in the processing container 12 on the lower side of the exhaust plate 48. The exhaust device 50 is connected to the exhaust port 12e via the exhaust pipe 52. The exhaust device 50 includes a vacuum pump such as a turbomolecular pump and can reduce the pressure of the space in the processing container 12 to a desired degree of vacuum. The import and export port 12g is an import and export port of the wafer W. The import and export port 12g is provided in the side wall of the processing container 12. The import and export port 12g can be opened and closed by the gate valve 54.

The first high-frequency power source 62 is a power source for generating first high-frequency power for plasma generation and generates high-frequency power at a frequency of 27 to 100 [MHz], as an example, 40 [MHz]. The first high-frequency power source 62 is connected to the upper electrode 30 via the matching device 66. The matching device 66 is a circuit for matching the output impedance of the first high-frequency power source 62 and the input impedance of a load side (the lower electrode LE side). In addition, the first high-frequency power source 62 may also be connected to the lower electrode LE via the matching device 66.

In addition, the plasma processing apparatus 10 further includes the power source 70. The power source 70 is connected to the upper electrode 30. The power source 70 applies a voltage for attracting positive ions that exist in the processing space Sp toward the electrode plate 34 to the upper electrode 30. As an example, the power source 70 is a DC power source that generates a negative DC voltage. When the voltage is applied from the power source 70 to the upper electrode 30, the positive ions that exist in the processing space Sp collide with the electrode plate 34. Accordingly, secondary electrons and/or silicon are emitted from the electrode plate 34.

The second high-frequency power source 64 is a power source for generating second high-frequency power for attracting ions toward the wafer W, that is, high-frequency bias power, and generates high-frequency bias power at a frequency in a range of 400 to 13.56 [MHz], as an example, 12.88 [MHz]. The second high-frequency power source 64 is connected to the lower electrode LE via the matching device 68. The matching device 68 is a circuit for matching the output impedance of the second high-frequency power source 64 and the input impedance of the load side (the lower electrode LE side).

The controller Cnt is a computer provided with, a processor, a storage unit, an input device, a display device, and the like and controls each unit of the plasma processing apparatus 10. Specifically, the controller Cnt is connected to the valve group 42, the flow rate controller group 44, the exhaust device 50, the first high-frequency power source 62, the matching device 66, the second high-frequency power source 64, the matching device 68, the power source 70, the heater power source HP, and the chiller unit.

The controller Cnt is operated according to programs based on an input recipe and transmits control signals. According to the control signals from the controller Cnt, the selection of gases supplied from the gas source group and the flow rates thereof, the exhaust from the exhaust device 50, the supply of power from the first high-frequency power source 62 and the second high-frequency power source 64, the application of a voltage from the power source 70, the supply of power from the heater power source HP, and the flow rate and the temperature of the refrigerant from the chiller unit can be controlled. Each process in the method of processing a workpiece disclosed in this specification may be executed by operating each unit of the plasma processing apparatus 10 according to the control by the controller Cnt.

Returning to FIG. 1, the method MT will be described in detail. Hereinafter, an example in which the plasma processing apparatus 10 is used to execute the method MT will be described. In addition, in the following description, FIGS. 3A and 3B are referred to FIGS. 3A and 3B are sectional views illustrating the states of the workpiece before execution and after execution of each of the processes of the method shown in FIG. 1.

In the method MT shown in FIG. 1, first, the wafer W is prepared in a process ST1. As illustrated in FIG. 3A, the wafer W prepared in the process ST1 includes a substrate SB, a base layer FL, a porous film PM1, and a mask MK1. The base layer FL is provided on the substrate SB. The base layer FL is formed of a material which is less likely to be etched during etching of the porous film PM1. For example, the material of the base layer FL is SiCN or the like. The porous film PM1 is provided on the base layer FL. A large number of holes are formed inside the porous film PM1. The porous film PM1 exhibits a function of a low dielectric constant film due to the plurality of holes. For example, the material of the porous film PM1 is SiOCH or the like. The mask MK1 is provided on the porous film PM1. The mask MK1 partially covers the porous film PM1. The mask MK1 is a mask used for etching of the porous film PM1. For example, the material of the mask MK1 is TiN or the like. For example, the pattern of the mask MK1 is a line-and-space pattern. In addition, the mask MK1 may have a pattern which provides a circular opening in a plan view. Otherwise, the mask MK1 may have a pattern which provides an elliptical opening in the plan view.

Figure 3A:
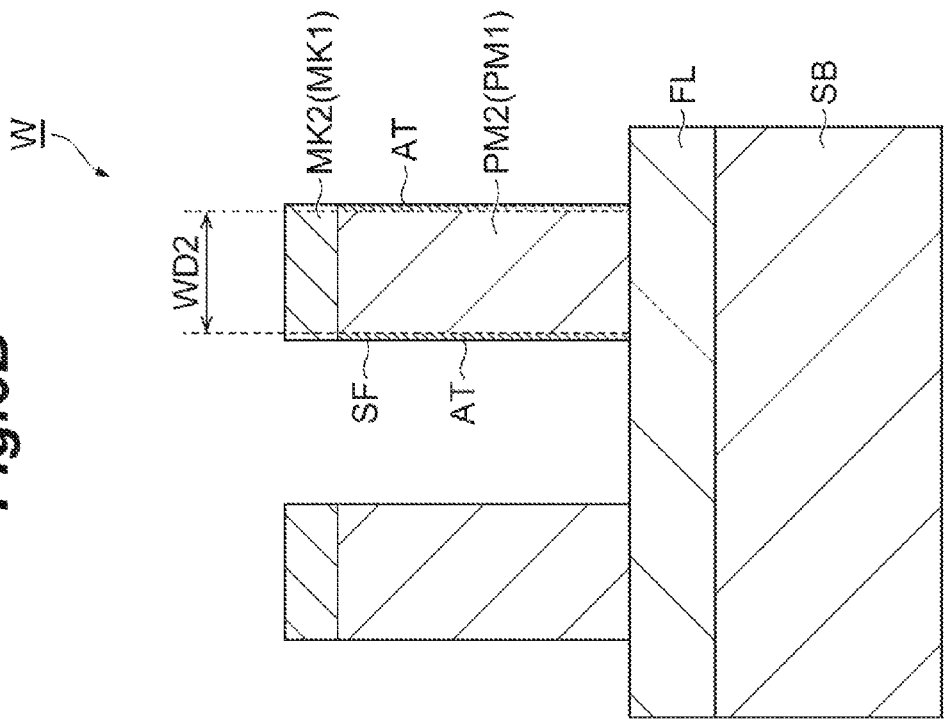
FIGS. 3A and 3B are sectional views illustrating the states of an exemplary workpiece before execution and after execution of each of processes of a method shown in FIG. 4 or 5.
Figure 3B:
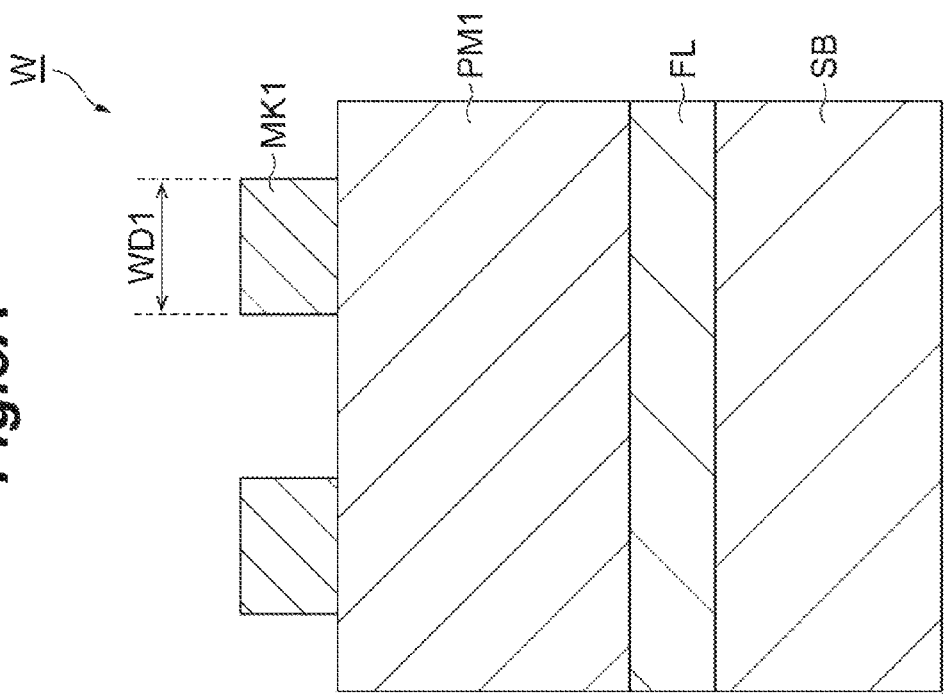

In the process ST1, the wafer W illustrated in FIG. 3A is prepared, and the wafer W is accommodated in the processing container 12 of the plasma processing apparatus 10 and is placed on the placing table PD.

Figure 4:
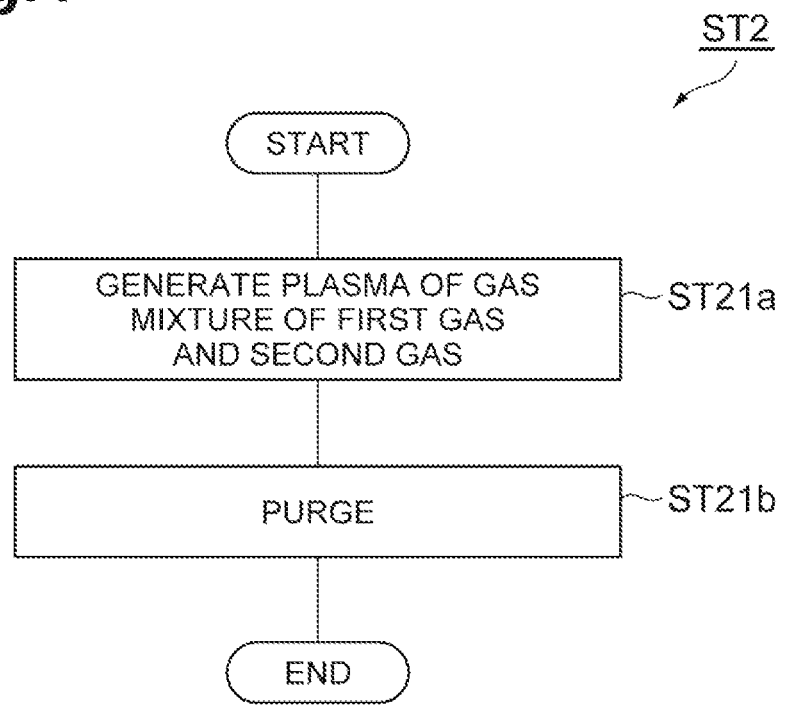
FIG. 4 is a flowchart showing an exemplary embodiment of a process of etching a porous film illustrated in FIG. 1.
Figure 5:
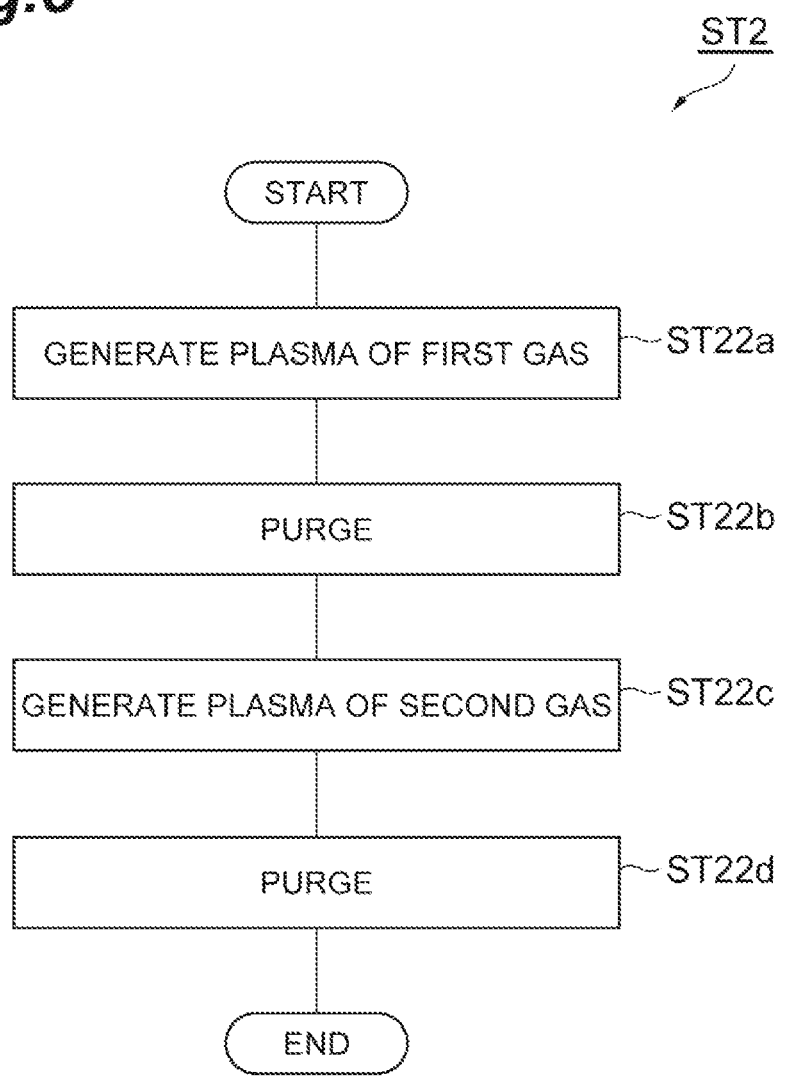
FIG. 5 is a flowchart showing another exemplary embodiment of a process of etching a porous film illustrated in FIG. 1.

In the method MT of the exemplary embodiment, subsequently, a process ST2 is executed. In the process ST2, the porous film PM1 is etched. In the process ST2, any one process of a process shown in FIG. 4 and a process shown in FIG. 5 is executed. The porous film PM1 etched in the process ST2 becomes a porous film PM2 as illustrated in FIG. 3B. The porous film PM2 has an altered region AT. On a side surface SF of the porous film PM2, the altered region AT is formed through etching performed in the process ST2. The altered region AT is formed by C (carbon) separated from the surface of the porous film PM1 formed of SiOCH and the inner surfaces of the plurality of holes of the porous film PM1 due to active species in a plasma generated in the process ST2, and has a composition of $SiO_2$. The altered region AT can be easily removed by dilute hydrofluoric acid. In addition, the mask MK1 becomes a mask MK2 due to the etching in the process ST2. In addition, details of the content of the process ST2 will be particularly described later in detail.

Next, an exemplary embodiment of the process ST2 (a process of etching the porous film PM1) shown in FIG. 1 will be described in detail with reference to FIGS. 4 and 5. First, the process ST2 according to the exemplary embodiment will be described with reference to FIG. 4. The process ST2 shown in FIG. 4 includes a process ST2*l*a and a process ST21*b*.

In the process ST21*a*, a gas mixture of a first gas and a second gas is supplied into the processing container 12. The first gas is a processing gas containing a fluorocarbon-based gas, and the second gas is a processing gas containing GeF$_4$ gas. In addition, a plasma of the gas mixture supplied into the processing container 12 is generated in the processing container 12. Specifically, a processing gas containing the gas mixture of the first gas and the second gas is supplied from gas sources selected from among the plurality of gas sources of the gas source group 40 into the processing container 12. In addition, high-frequency power is supplied from the first high-frequency power source 62. In addition, high-frequency bias power is supplied from the second high-frequency power source 64. Furthermore, by operating the exhaust device 50, the pressure of the space in the processing container 12 is set to a predetermined pressure. Accordingly, a plasma of the gas mixture of the first gas and the second gas is generated. Active species of F (fluorine) in the plasma generated in the process ST21a cause a region of the entire region of the porous film PM1 exposed from the mask MK1 to be etched to reach the base layer FL. Active species of Ge (germanium) in the plasma generated in the process ST21a form a protective film containing Ge on the side surfaces of the porous films (surfaces of the porous film PM1 and the porous film PM2 formed during the etching and surfaces extending in a direction perpendicular to the interface between the base layer FL and the porous film PM1 and the porous film PM2).

For example, the gas mixture used in the process ST21a is either a gas mixture containing GeF$_4$ gas and CF$_4$ gas or a gas mixture containing GeF$_4$ gas, C$_4$F$_8$ gas, N$_2$ gas, O$_2$ gas, and Ar gas.

The flow rate of the gas mixture used in the process ST21a will be described. In a case where the fluorocarbon-based gas of the first gas contained in the gas mixture contains CF$_4$ gas and the second gas contained in the gas mixture contains GeF$_4$ gas, the flow rate of the GeF$_4$ gas contained in the second gas may be 10 percent or more of the flow rate of the CF$_4$ gas contained in the first gas. In addition, in a case where the fluorocarbon-based gas of the first gas contained in the gas mixture contains C$_4$F$_8$ gas and the second gas contained in the gas mixture contains GeF$_4$ gas, the flow rate of the GeF$_4$ gas contained in the second gas may be ½ or more of the flow rate of the C$_4$F$_8$ gas contained in the first gas or may be equal to or more than the flow rate of the C$_4$F$_8$ gas contained in the first gas.

In the subsequent process ST21b, the space of the processing container 12 is purged. Specifically, the processing gas supplied in the process ST21a is discharged from the processing container 12. In the process ST21b, an inert gas such as nitrogen gas as a purge gas may be supplied to the processing container 12. That is, purging performed in the process ST21b may be either gas purging in which an inert gas is caused to flow into the processing container 12 or purging through vacuuming.

Next, the process ST2 according to another exemplary embodiment will be described with reference to FIG. 5. The process ST2 shown in FIG. 5 includes a process ST22a (first process), a process ST22b (second process), a process ST22c (third process), and a process ST22d (fourth process).

In the process ST22a, a first gas is supplied into the processing container 12. The first gas is a processing gas containing a fluorocarbon-based gas. For example, the first gas used in the process ST22a may contain either C$_4$F$_8$ gas, N$_2$ gas, O$_2$ gas, and Ar gas or CF$_4$ gas and Ar gas. In addition, a plasma of the first gas supplied into the processing container 12 is generated in the processing container 12. Specifically, the processing gas containing the first gas is supplied from gas sources selected from among the plurality of gas sources of the gas source group 40 into the processing container 12. In addition, high-frequency power is supplied from the first high-frequency power source 62. In addition, high-frequency bias power is supplied from the second high-frequency power source 64. Furthermore, by operating the exhaust device 50, the pressure of the space in the processing container 12 is set to a predetermined pressure. Accordingly, the plasma of the first gas is generated. Active species of F (fluorine) in the plasma generated in the process ST22a cause a region of the entire region of the porous film PM1 exposed from the mask MK1 to be etched.

In the subsequent process ST22b, the space in the processing container 12 is purged. Specifically, the processing gas supplied in the process ST22a is discharged from the processing container 12. In the process ST22b, an inert gas such as nitrogen gas as a purge gas may be supplied to the processing container 12. That is, purging performed in the process ST22b may be either gas purging in which an inert gas is caused to flow into the processing container 12 or purging through vacuuming. In addition, the process ST22b may also be omitted.

In the subsequent process ST22c, the second gas is supplied into the processing container 12. The second gas is a processing gas containing GeF$_4$ gas. For example, the second gas used in the process ST22c contains GeF$_4$ and Ar gas. In addition, the plasma of the first gas supplied into the processing container 12 is generated in the processing container 12. Specifically, the processing gas containing the second gas is supplied from gas sources selected from among the plurality of gas sources of the gas source group 40 into the processing container 12. In addition, high-frequency power is supplied from the first high-frequency power source 62. In addition, high-frequency bias power is supplied from the second high-frequency power source 64. Furthermore, by operating the exhaust device 50, the pressure of the space in the processing container 12 is set to a predetermined pressure. Accordingly, a plasma of the second gas is generated. Active species of Ge (germanium) in the plasma generated in the process ST22c form a protective film containing Ge on the side surfaces of the porous films (surfaces of the porous film PM1 and the porous film PM2 formed during the etching and surfaces extending in a direction perpendicular to the interface between the base layer FL and the porous film PM1 and the porous film PM2). Active species such as F (fluorine) in the plasma generated in the process ST22c cause a region of the entire region of the porous film PM1 exposed from the mask MK1 to be etched. In addition, in the process ST2 shown in FIG. 5, the etching may be performed only by the execution of the process ST22c without the execution of the process ST22a. However, adjustment for the compatibility between the protection of a side wall due to Ge (germanium), the protection of the mask due to carbon, and the prevention of a tapered shape being formed due to an increase in deposits on the side wall is less likely to be achieved compared to a case where processes are divided as in the process ST2 shown in FIG. 5 (that is, a case where the process ST22a is executed and the process ST22c is executed).

In the subsequent process ST22d, the space of the processing container 12 is purged. Specifically, the processing gas supplied in the process ST22c is discharged from the processing container 12. In the process ST22d, an inert gas such as nitrogen gas as a purge gas may be supplied to the processing container 12. That is, purging performed in the process ST22d may be either gas purging in which an inert gas is caused to flow into the processing container 12 or purging through vacuuming. In addition, the process ST22d may also be omitted.

In the process ST2 shown in FIG. 5, the process ST22a and the process ST22b are executed once or several times, and the process ST22c and the process ST22d are executed once or several times. Specifically, after performing the process ST22a and the process ST22b, the process ST22c and the process ST22d are performed. However, the porous film PM1 may be etched to reach the base layer FL by repeatedly performing the processes ST22a to ST22d N times (N is a natural number) until the porous film PM1 is etched to reach the base layer FL. Otherwise, the porous film PM1 may be etched to reach the base layer FL by repeatedly performing the processes ST22a to ST22d N times and thereafter further performing the process ST22a and the process ST22b one more time.

The formation of the protective film containing Ge in the process ST2 on the side surface of the porous film (the side surface of the pattern) will be described on the basis of an experiment described below. First, a silicon substrate wafer was placed on a placing table PD in a processing container of a plasma processing apparatus. A line pattern was already formed on the surface of the silicon substrate. A plasma of $GeF_4$ and Ar was caused to irradiate the surface of the wafer. During the generation of the plasma, the plasma was generated as a high-frequency power of 200 [W] at 40 [MHz] was supplied from the substrate side, and simultaneously, the attraction of ions to the wafer had occurred simultaneously with the deposition of Ge (germanium) due to a self-bias voltage caused by the high-frequency power. In the surface of the silicon pattern, the deposition of Ge (germanium) was relatively less likely to occur in a region with a large pattern opening or in an upper portion of the pattern but etching became dominant. However, in an inner portion of the pattern with a relatively high aspect ratio, the deposition of Ge on the bottom portion of the groove of the pattern was observed. In general, regarding the transportation of active species toward the bottom portion of the groove of a pattern, when the active species collide with a side surface extending from the bottom portion, as a probability that the active species may stick to the side surface and remain at the place (sticking coefficient) decreases, the active species reach the bottom portion. As a result, the deposition of Ge (germanium) on the pattern can be formed conformally (for example, refer to J. G. Shaw and C. C. Tsai: Journal of Applied Physics, 64, 699 (1988), and A. Yuuki, Y. Matui and K. Tachibana: Japanese Journal of Applied Physics, 28, 212 (1989)). The fact that the deposition of Ge (germanium), which was rarely observed in an open region of the surface of the silicon film, was observed at the bottom portion of the groove of the pattern with a relatively high aspect ratio indicates that a larger amount of active species of Ge (germanium) free from the plasma than active species of F (fluorine) had reached the bottom portion, that is, the sticking coefficient of the active species of Ge (germanium) is lower than the sticking coefficient of the active species of F (fluorine). As described above, the deposition of Ge (germanium) on the side surface of the porous film (the side surface of the pattern) is conformal. As described above, the protective film containing Ge (germanium) in the process ST2 is formed on the side surface of the porous film PM1 conformally.

Hereinafter, various Experimental Examples 1 to 9 performed for the evaluation of the method MT will be described with reference to FIGS. 3A, 3B, 4 and 6. Experimental Examples 1 to 9 are experimental examples according to the exemplary embodiment shown in FIG. 4.

First, Experimental Examples 1 to 3 will be described. In Experimental Examples 1 to 3, common conditions of the process ST21a are as follows.

Pressure in the processing container 12: 20 [mTorr]
High-frequency power of the first high-frequency power source 62: 40 [MHz], 300 [W]
High-frequency bias power of the second high-frequency power source 64: 12.88 [MHz], 125 [W]
Temperature of the upper portion of the processing container 12: 150 [° C.]
Temperature of the side wall of the processing container 12: 150 [° C.]
Temperature of the lower portion of the processing container 12: 20 [° C.]
Pressure of He: 15 [Torr]
Porous film PM1: A porous low dielectric constant film having a composition of SiOCH deposited by a CVD method (the relative permittivity of the film was 2.55)

The processing time and the processing gas in the process ST21a in a case of Experimental Example 1, and the effects thereof were as follows. In addition, WD1 mentioned below is the average value of the width of the mask MK1 shown in FIG. 3A, WD2 is the average of values obtained by subtracting the widths of the altered regions AT formed on both side surfaces of the porous film PM2 from the width of the porous film PM2, and ΔWD12 is a value of WD1-WD2. In addition, the value of WD2 is the width of the porous film PM2, which remains after the altered region AT formed of $SiO_2$ formed on the side surface of the porous film PM2 is removed by immersing the wafer W, in which the porous film PM2 is formed in the process ST2, into dilute hydrofluoric acid (the description of WD1, WD2, and ΔWD12 described above is similarly applied to the following description).

Processing time: 20 [s] (s is seconds, the same is applied below)
Processing gas: $CF_4$ gas
Flow rate of $CF_4$ gas: 300 [sccm]
WD1: 47.6 [nm]
WD2: 37.0 [nm]
ΔWD12: 10.6 [nm]

The processing time and the processing gas of the process ST21a in a case of Experimental Example 2, and the effects thereof were as follows.

Processing time: 30 [s]
Processing gas: $CF_4$ gas and $SiF_4$ gas
Flow rate of $CF_4$ gas: 100 [sccm]
Flow rate of $SiF_4$ gas: 200 [sccm]
WD1: 48.9 [nm]
WD2: 43.7 [nm]
ΔWD12: 5.2 [nm]

The processing time and the processing gas of the process ST21a in a case of Experimental Example 3, and the effects thereof were as follows.

Processing time: 30 [s]
Processing gas: $CF_4$ gas and $GeF_4$ gas
Flow rate of $CF_4$ gas: 175 [sccm]
Flow rate of $GeF_4$ gas: 25 [sccm]
WD1: 44.9 [nm]
WD2: 41.4 [nm]
ΔWD12: 3.5 [nm]

In Experimental Example 1, only the $CF_4$ gas was used as the processing gas, and in Experimental Example 2, the $SiF_4$ gas was used along with the $CF_4$ gas as the processing gas. It could be seen that the formation of the altered region AT was further suppressed in Experimental Example 2 than in Experimental Example 1. This is because a Si (silicon)

protective film of $SiF_4$ having an effect of protection against active species of F (fluorine) was formed on the side surface of the porous film (surface formed during etching). Furthermore, in Experimental Example 3, the $GeF_4$ gas was used along with the $CF_4$ gas as the processing gas, and $SiF_4$ gas was not used. It could be seen that the formation of the altered region AT was further suppressed in Experimental Example 3 than in Experimental Example 2. This is because a protective film of Ge (germanium) of $GeF_4$ has a higher effect of protection against active species of F (fluorine) than the Si (silicon) protective film of $SiF_4$. This is also because the binding energy (576 [kJ/mol]) of F—Si is higher than the binding energy (523 [kJ/mol]) of F—Ge, $GeF_4$ can be more easily separated in a plasma than $SiF_4$, and $GeF_4$ has a higher deposition efficiency than $SiF_4$. In addition, in the case of Experimental Example 3, the flow rate (=25 [sccm]) of the $GeF_4$ gas was approximately 14 percent (that is, 10 percent or more) of the flow rate (175 [sccm]) of the $CF_4$ gas.

Next, Experimental Examples 4 to 9 will be described. In Experimental Examples 4 to 9, common conditions of the process ST21a are as follows.
- Pressure in the processing container 12: 70 [mTorr]
- High-frequency power of the first high-frequency power source 62: 40 [MHz], 250 [W]
- High-frequency bias power of the second high-frequency power source 64: 12.88 [MHz], 100 [W]
- Temperature of the upper portion of the processing container 12: 150 [° C.]
- Temperature of the side wall of the processing container 12: 150 [° C.]
- Temperature of the lower portion of the processing container 12: 60 [° C.]
- Applied voltage of the power source 70: 600 [V]
- Pressure of He: 30 [Torr]
- Flow rate of $C_4F_8$ gas: 40 [sccm]
- Flow rate of $N_2$ gas: 50 [sccm]
- Flow rate of $O_2$ gas: 15 [sccm]
- Flow rate of Ar gas: 1000 [sccm]
- Porous film PM1: A porous low dielectric constant film having a composition of SiOCH deposited by a CVD method (the relative permittivity of the film was 2.55)

The processing time and the other processing gases in the process ST21a in a case of Experimental Example 4, and the effects thereof were as follows.
- Processing time: 114 [s]
- Other processing gases: Absent
- WD1: 50.2 [nm]
- WD2: 46.2 [nm]
- ΔWD12: 4.0 [nm]

The processing time and the other processing gases in the process ST21a in a case of Experimental Example 5, and the effects thereof were as follows.
- Processing time: 114 [s]
- Other processing gases: $CF_4$ gas
- Flow rate of $CF_4$ gas: 50 [sccm]
- WD1: 34.4 [nm]
- WD2: 31.8 [nm]
- ΔWD12: 2.6 [nm]

The processing time and the other processing gases in the process ST21a in a case of Experimental Example 6, and the effects thereof were as follows.
- Processing time: 142 [s]
- Other processing gases: $GeF_4$ gas
- Flow rate of $GeF_4$ gas: 50 [sccm]
- WD1: 43.6 [nm]
- WD2: 41.0 [nm]
- ΔWD12: 2.6 [nm]

The processing time and the other processing gases in the process ST21a in a case of Experimental Example 7, and the effects thereof were as follows.
- Processing time: 142 [s]
- Other processing gases: $GeF_4$ gas
- Flow rate of $GeF_4$ gas: 50 [sccm]
- WD1: 48.9 [nm]
- WD2: 46.2 [nm]
- ΔWD12: 2.7 [nm]

The processing time and the other processing gases in the process ST21a in a case of Experimental Example 8, and the effects thereof were as follows.
- Processing time: 160 [s]
- Other processing gases: $GeF_4$ gas
- Flow rate of $GeF_4$ gas: 75 [sccm]
- WD1: 51.5 [nm]
- WD2: 48.9 [nm]
- ΔWD12: 2.6 [nm]

The processing time and the other processing gases in the process ST21a in a case of Experimental Example 9, and the effects thereof were as follows.
- Processing time: 180 [s]
- Other processing gases: $GeF_4$ gas
- Flow rate of $GeF_4$ gas: 100 [sccm]
- WD1: 47.6 [nm]
- WD2: 45.0 [nm]
- ΔWD12: 2.6 [nm]

It could be seen that in the cases of Experimental Examples 5 to 9 in which the processing gas contained the $C_4F_8$ gas, the $N_2$ gas, the $O_2$ gas, and the Ar gas and contained either the $CF_4$ gas or the $GeF_4$ gas, compared to the case of Experimental Example 4 in which the processing gas contained the $C_4F_8$ gas, the $N_2$ gas, the $O_2$ gas, and the Ar gas and did not contain $CF_4$ gas and $GeF_4$ gas, the formation of the altered region AT was suppressed. In addition, although not included in numerical values according to the above-described effects, in the case of Experimental Example 5 in which the $CF_4$ gas was contained in the processing gas among Experimental Examples 5 to 9, compared to Experimental Examples 6 to 9 in which $CF_4$ was not contained but $GeF_4$ was contained, erosion due to the etching performed on the mask MK1 and the base layer FL was significant. In addition, in the cases of Experimental Examples 6 to 9, the flow rate (=50, 75, 100 [sccm]) of the $GeF_4$ gas was ½ or more of the flow rate (=40 [sccm]) of the $C_4F_8$ gas and was equal to or more than the flow rate 40 [sccm]) of the $C_4F_8$ gas.

In addition, although not included in numerical values according to the above-described effects, in Experimental Examples 6 to 9, as the flow rate of the $GeF_4$ gas increases, the selectivity of the porous film PM1 to the mask MK1 is enhanced, and the shape (particularly the shape of the edge portion of the upper surface of the mask MK2) of the mask MK2 was close to the corresponding shape of the mask MK1. It is thought that this is because since the sticking coefficient of active species of Ge is relatively low, the protective film of Ge (germanium) is conformally formed, and the effect of protection by the protective film of Ge (germanium) against etching due to active species of F (fluorine) and the effect of etching due to the active species of F (fluorine) are balanced.

Figure 6:
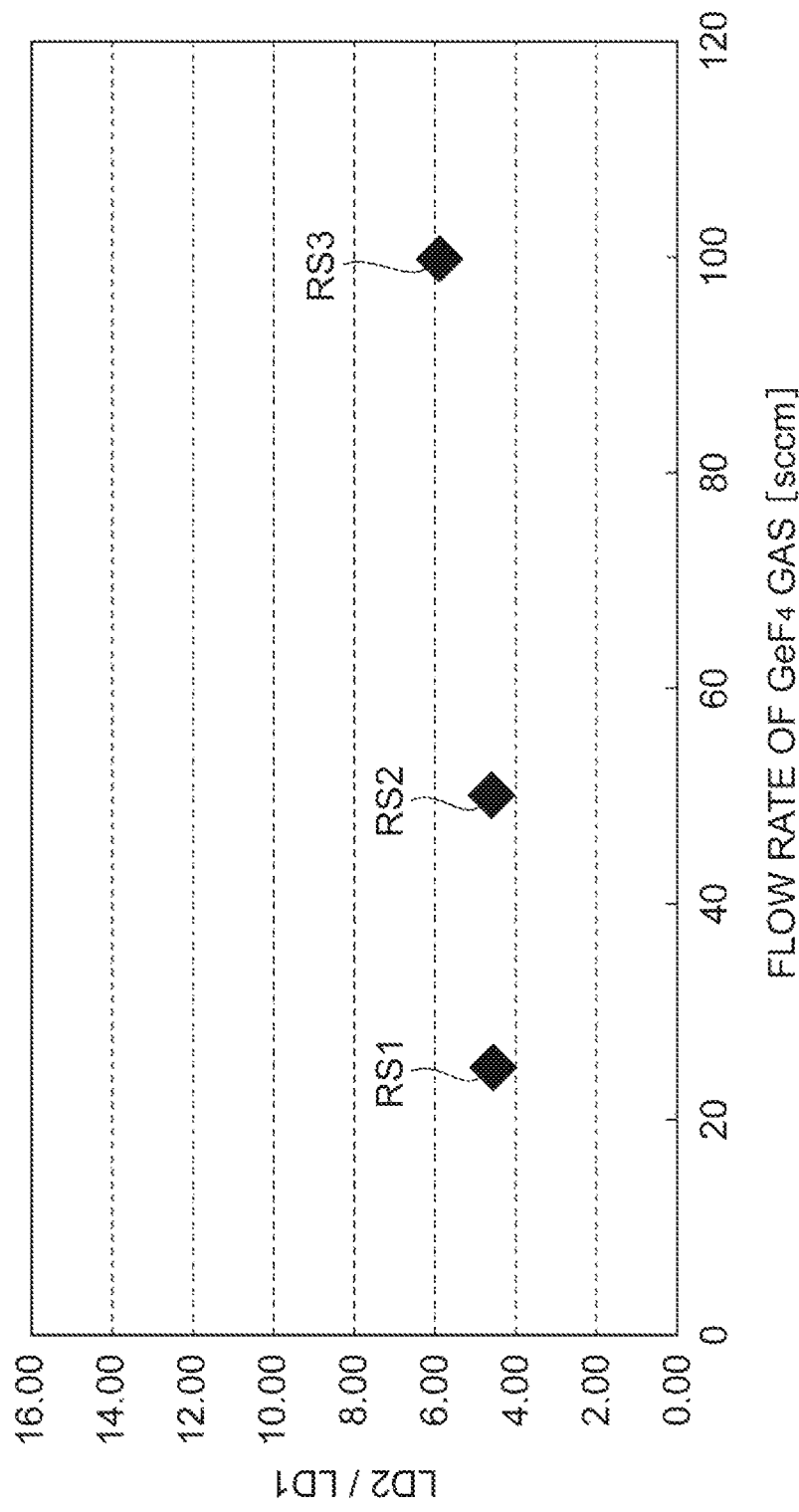
FIG. 6 is a graph showing experimental results.

The above-described correlation between an increase in the flow rate of the $GeF_4$ gas and an improvement in the selectivity is shown in experimental results shown in FIG. 6. FIG. 6 is a graph showing the experimental results. The contents of an experiment associated with the experimental results of FIG. 6 will be described. First, a first blanket wafer in which a TiN film was provided on the surface of a substrate, and a second blanket wafer in which a porous film (this film was a porous low dielectric constant film having a composition of SiOCH deposited by a CVD method, and the relative permittivity of the film was 2.55) was provided on the surface of a substrate were prepared. The TIN film of the first blanket wafer is an example of the material of the mask MK1 of the wafer W illustrated in FIG. 3A, and the corresponding porous film of the second blanket wafer is an example of the material of the porous film PM1 illustrated in FIG. 3A. First, the first blanket wafer was accommodated in the processing container 12 of the plasma processing apparatus 10 and was placed on the placing table PD, and etching was performed on the TIN film under the following conditions.

Pressure in the processing container 12: 70 [mTorr]
High-frequency power of the first high-frequency power source 62: 40 [MHz], 250 [W]
High-frequency bias power of the second high-frequency power source 64: 12.88 [MHz], 100 [W]
Temperature of the upper portion of the processing container 12: 150 [° C.]
Temperature of the side wall of the processing container 12: 150 ['V]
Temperature of the lower portion of the processing container 12: 60 [° C.]
Applied voltage of the power source 70: 600 [V]
Pressure of He: 30 [Torr]
Flow rate of $C_4F_8$ gas: 40 [sccm]
Flow rate of $N_2$ gas: 50 [sccm]
Flow rate of $O_2$ gas: 15 [sccm]
Flow rate of Ar gas: 1000 [sccm]
Processing time: 60 [s]
Flow rate of $GeF_4$ gas (three cases): 25, 50, 100 [sccm]

The horizontal axis of FIG. 6 represents the above-described flow rate [sccm] of the $GeF_4$ gas. In addition, in the experiment, whenever the flow rate of the $GeF_4$ gas was changed and whenever the wafer was replaced, the inside of the processing container 12 was purged.

A variation (a value obtained by subtracting a thickness after etching from a thickness before the etching, referred to as LD1) in the thickness of the TiN film of the first blanket wafer before and after etching performed under the above-described conditions was as follows.

LD1 in a case where the flow rate of the $GeF_4$ gas was 25 [sccm]: 16.01 [nm]
LD1 in a case where the flow rate of the $GeF_4$ gas was 50 [sccm]: 14.91 [nm]
LD1 in a case where the flow rate of the $GeF_4$ gas was 100 [sccm]: 9.52 [nm]

The second blanket wafer was etched under the same conditions as the above-described conditions of the etching performed on the first blanket wafer. A variation in the thickness of the porous film of the second blanket wafer before and after the etching (a value obtained by subtracting a thickness after etching from a thickness before the etching, referred to as LD2) was as follows.

LD2 in a case where the flow rate of the $GeF_4$ gas was 25 [sccm]: 71.47 [nm]
LD2 in a case where the flow rate of the $GeF_4$ gas was 50 [sccm]: 67.55 [nm]
LD2 in a case where the flow rate of the $GeF_4$ gas was 100 [sccm]: 56.09 [nm]

The vertical axis of FIG. 6 represents the value of LD2/LD1 at each flow rate of the $GeF_4$ gas.

As the value of each of LD1 and LD2 decreases, the variation before and after the etching decreases. Therefore, it can be seen that in the wafer W illustrated in FIG. 3A, as the value of LD2/LD1 increases, the selectivity of the porous film PM1 to the mask MK1 formed of TiN is improved. In addition, FIG. 6 shows that the value of LD2/LD1 (experimental result RS1) in the case where the flow rate of the $GeF_4$ gas is 25 [sccm] is 4.46, the value of LD2/LD1 (experimental result RS2) in the case where the flow rate of the $GeF_4$ gas is 50 [sccm] is 4.53, and the value of LD2/LD1 (experimental result RS3) in the case where the flow rate of the $GeF_4$ gas is 100 [sccm] is 5.89. Referring to the experimental results RS1 to RS3, it can be seen that in the wafer W illustrated in FIG. 3A, as the flow rate of $GeF_4$ increases, the selectivity of the porous film PM1 to the mask MK1 formed of TiN is improved.

According to the exemplary embodiment described above, in a case where the porous film PM1 formed of SiOCH is etched by the plasma of the fluorocarbon-based gas containing F (fluorine), C (carbon) becomes separated from the side surfaces of the porous films (surfaces of the porous film PM1 and the porous film PM2 formed during the etching and surfaces extending in a direction perpendicular to the interface between the base layer FL and the porous film PM1 and the porous film PM2) and the inner surfaces of the plurality of holes of the porous film PM1 on the side surface due to the active species of F (fluorine) and the like generated by the plasma such that the porous film PM1 exhibits hydrophilicity. Therefore, there may be cases where the dielectric constant, dielectric strength, reliability, and the like are deteriorated. However, in a case where the porous film PM1 is etched by the plasma in the process ST2, a film of Ge (germanium) having relatively high resistance to erosion due to the active species of F (fluorine) and the like is formed by the active species of Ge (germanium) generated by the plasma on the side surfaces of the porous films (surfaces of the porous film PM1 and the porous film PM2 formed during the etching and surfaces extending in a direction perpendicular to the interface between the base layer FL and the porous film PM1 and the porous film PM2) and the inner surfaces of the plurality of holes of the porous film PM1 on the side surface side, such that the separation of C (carbon) from the side surfaces and the inner surfaces due to the active species of F (fluorine) and the like is suppressed. Therefore, the deterioration in the dielectric constant, dielectric strength, reliability, and the like of the porous film PM1 is suppressed.

In addition, in the process ST21a of the process ST2, by supplying the gas mixture of the first gas and the second gas into the processing container 12, a plasma of the gas mixture can be generated in the processing container 12. As described above, when the plasma of the gas mixture containing the fluorocarbon-based gas and the $GeF_4$ gas is used, the effect of protection by the film of Ge (germanium) can be obtained while the etching performed by the active species of F (fluorine) and the like can be achieved in only a single etching process using the gas mixture. Therefore, while sufficiently preventing a situation in which the characteristics of the porous film PM1 are deteriorated due to the separation of C (carbon) caused by the active species of F (fluorine) and the like, the etching of the porous film PM1 can be suitably and easily performed.

In addition, the process ST2 may include the process ST22a of generating the plasma of the first gas, the process of ST22b of purging the processing space Sp in the processing container 12 after the execution of the process ST22a, the process ST22c of generating the plasma of the second gas after the execution of the process ST22b, and the process ST22d of purging the space in the processing container 12 after the execution of the process ST22c. As described above, by separately performing the process ST22a of performing etching using the plasma of the fluorocarbon-based gas and the process ST22c of forming the protective film of Ge (germanium) using the plasma of the $GeF_4$ gas from each other, the etching process performed on the porous film PM1 can be precisely and flexibly performed so as to suppress the separation of C (carbon) and the like and maintain the characteristics of the porous film PM1.

In addition, in the process ST2, the process ST22a and the process ST22b may be executed once or several times, and the process ST22c and the process ST22d may be executed once or several times. As described above, by appropriately adjusting the number of times of execution of the process ST22a of performing the etching using the plasma of the fluorocarbon-based gas and the number of times of execution of the process ST22c of forming the protective film of Ge (germanium) using the plasma of the $GeF_4$ gas, the balance between the etching performed due to the active species of F (fluorine) and the like and the effect of protection by the film of Ge (germanium) can be sufficiently and suitably obtained. Therefore, the etching of the porous film PM1 can be more precisely and flexibly performed while maintaining the characteristics of the porous film PM1.

In addition, the fluorocarbon-based gas of the first gas of the gas mixture used in the process ST21a may contain the $CF_4$ gas, and the flow rate of the $GeF_4$ gas contained in the second gas of the gas mixture may be 10 percent or more of the flow rate of the $CF_4$ gas contained in the first gas. As described above, in a case where the $CF_4$ gas and the $GeF_4$ gas are contained in the gas mixture, it became apparent that by causing the flow rate of the $GeF_4$ gas to be 10 percent or more of the flow rate of the $CF_4$ gas, the etching of the porous film PM1 can be suitably performed while maintaining the characteristics of the porous film PM1.

In addition, the fluorocarbon-based gas of the first gas of the gas mixture used in the process ST21a may contain the $C_4F_8$ gas and the flow rate of the $GeF_4$ gas contained in the second gas of the gas mixture may be ½ or more of the flow rate of the $C_4F_8$ gas contained in the first gas. In addition, the fluorocarbon-based gas of the first gas of the gas mixture used in the process ST21a may contain the $C_4F_8$ gas and the flow rate of the $GeF_4$ gas contained in the second gas of the gas mixture may be equal to or more than the flow rate of the $C_4F_8$ gas contained in the first gas. As described above, in the case where the $C_4F_8$ gas and the $GeF_4$ gas are contained in the gas mixture, it became apparent that by causing the flow rate of the $GeF_4$ gas to be ½ or more of the flow rate of the $C_4F_8$ gas or equal to or more than the flow rate of the $C_4F_8$ gas, the etching of the porous film PM1 can be suitably performed while maintaining the characteristics of the porous film PM1.

Although various exemplary embodiments have been described above, various modified aspect may be configured without being limited to the above-described exemplary embodiments. For example, in performing the method MT, an inductive coupling type plasma processing apparatus may be used without being limited to the plasma processing apparatus which uses microwaves as a plasma source.

From the foregoing description, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of processing a workpiece including a porous film and a mask provided on the porous film, performed in a processing container of a plasma processing apparatus, the method comprising:
   a process of generating a plasma in the processing container using a first gas and a second gas and etching the porous film using the mask,
   wherein the porous film contains SiOCH,
   the first gas contains a fluorocarbon-based gas, and
   the second gas contains $GeF_4$ gas.

2. The method according to claim 1,
   wherein, in the process of etching the porous film, a gas mixture of the first gas and the second gas is supplied into the processing container, and a plasma of the gas mixture is generated in the processing container.

3. The method according to claim 1,
   wherein the process of etching the porous film includes
   a first process of generating a plasma of the first gas,
   a second process of purging a space in the processing container after execution of the first process,
   a third process of generating a plasma of the second gas after execution of the second process, and
   a fourth process of purging the space in the processing container after execution of the third process.

4. The method according to claim 3,
   wherein, in the process of etching the porous film, the first process and the second process are executed once or several times, and the third process and the fourth process are executed once or several times.

5. The method according to claim 2,
   wherein the fluorocarbon-based gas of the first gas contains $CF_4$ gas, and
   a flow rate of the $GeF_4$ gas contained in the second gas is 10 percent or more of a flow rate of the $CF_4$ gas contained in the first gas.

6. The method according to claim 2,
   wherein the fluorocarbon-based gas of the first gas contains $C_4F_8$ gas, and
   a flow rate of the $GeF_4$ gas contained in the second gas is ½ or more of a flow rate of the $C_4F_8$ gas contained in the first gas.

7. The method according to claim 2,
   wherein the fluorocarbon-based gas of the first gas contains $C_4F_8$ gas, and
   a flow rate of the $GeF_4$ gas contained in the second gas is equal to or more than a flow rate of the $C_4F_8$ gas contained in the first gas.

* * * * *